US006699051B2

(12) United States Patent
Hofmeister et al.

(10) Patent No.: US 6,699,051 B2
(45) Date of Patent: Mar. 2, 2004

(54) CABLE HARNESS CONNECTOR HAVING A COMPACT LOCKING ELEMENT

(75) Inventors: Werner Hofmeister, Muehlacker (DE); Wolfgang Pade, Illingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/124,870

(22) Filed: Apr. 18, 2002

(65) Prior Publication Data

US 2003/0032325 A1 Feb. 13, 2003

(30) Foreign Application Priority Data

Apr. 19, 2001 (DE) ........................................ 101 18 914

(51) Int. Cl.[7] .......................... H01R 13/62; H05K 5/00; H01B 1/00

(52) U.S. Cl. ...................... 439/157; 174/71 R; 361/732

(58) Field of Search ................................ 439/157, 347, 439/502, 136; 174/71 R; 361/732

(56) References Cited

U.S. PATENT DOCUMENTS 5,078,614 A * 1/1992 Shotey ....................... 439/136
5,709,560 A * 1/1998 Hio ............................ 439/157
5,727,959 A * 3/1998 Yagi et al. .................. 439/157
5,888,081 A * 3/1999 Konoya et al. ............. 439/157
6,217,354 B1 * 4/2001 Fencl et al. ................ 439/157
6,382,992 B1 * 5/2002 Bouchan et al. ............ 439/157

* cited by examiner

*Primary Examiner*—Chandrika Prasad
(74) *Attorney, Agent, or Firm*—Kenyon & Kenyon

(57) ABSTRACT

Traditional embodiments of cable harness connectors also have, in addition to a locking slide, a locking claw, arranged in a U shape over a connector housing of a cable harness connector, and the two locking elements assume both open and closed positions. To permit more advantageous manufacture of such cable harness connectors, the function of the locking claw is integrated into a cover of the cable harness connector, which is placed on the connector housing, so that the cover and the other locking unit are combined, this function having previously been implemented by the locking claw. Therefore, the cover and the second locking mechanism are designed as a one-piece part.

4 Claims, 3 Drawing Sheets

I

CABLE HARNESS CONNECTOR HAVING A COMPACT LOCKING ELEMENT

FIELD OF THE INVENTION

The present invention relates to an electric plug-and-socket connection having a connector housing with a connector having a cover detachably connected to a mating connector, the connector having a first locking mechanism in the form of a slide, which is movable from a first position into another position, and having a second locking mechanism which is also movable from a first position into another position, and which is provided for bringing the plug to the mating connector and locking it.

BACKGROUND INFORMATION

Electric plug-and-socket connections for connector parts of the type described above are known in a variety of forms.

They are used to ensure an electric connection between two connector parts to prevent inadvertent loosening of this connection.

A connector, also called a cable harness connector, has a connector housing and a cover and usually has a locking claw. This locking claw is arranged on the side walls of the cable harness connector in the form of a lever movable from a first position (opened position) into another position (closed position) by swiveling. While the cable harness connector is being positioned on a mating connector, the locking claw engages in two laterally projecting pins, and by depressing the locking claw in the direction of the cable harness connector, the cable harness connector is brought directly to the mating connector. This achieves the result of securing the electric plug-and-socket connection against shaking, i.e., so it will not open or loosen due to shaking, joggling, or the like.

Locking slides are also provided in other embodiments of cable harness connectors of the type described above. The locking slide is movable from an opened position to a closed position. To prevent the locking slide from moving or loosening under shaking stress or losing its closed position in any way, at least one catch hook is provided, cooperating in the closed position of the locking slide with a catch recess on the sides of the cable harness connector. By shifting the locking slide in the direction of the closed position, the catch hooks, which are arranged on the sides of the mating connector, slide onto a surface of the locking slide until they engage in a defined position.

Other embodiments provide locking slides as well as locking claws that are arranged together on an electric plug-and-socket connection. The function of the locking slide is to arrange the cable harness connector on the mating connector in the correct position, and the locking lever or locking claw is provided to secure the cable harness connector firmly on the mating connector.

One embodiment provides that the locking claw may only be swiveled when the locking slide has already reached its closed position.

An important disadvantage of the electric plug-and-socket connections known in the related art is that they have a great many parts, resulting in relatively high costs and therefore also a greater complexity in assembly.

SUMMARY OF THE INVENTION

An object of the present invention is to provide an electric plug-and-socket connection having two locking elements, a locking slide and a locking lever in such a way as to ensure a secure function in both closed and opened positions and to lower the cost of manufacturing such an electric plug-and-socket connection as well as reducing the assembly complexity.

According to the present invention, the cover and the second locking mechanism form a one-piece part.

An important advantage of the device according to the present invention is that the manufacturing cost, in particular that of the cable harness connector, is reduced by the fact that only one part is placeable on the connector housing, so that in addition to reducing the number of parts, assembly is also simplified.

In addition, the design according to the present invention permits in particular locking by displacement of the cover, and cable outlets may be provided on both front sides of the cable harness connector, without interfering with the locking per se.

In addition, the installation height of such an electric plug-and-socket connection may be lower because the usual lever design, which points away from the top part of the cable harness connector in the open position, i.e., while the cable harness connector is being placed on the mating connector, also takes up room for the swiveling movement. This effect is achieved by simple displacement of the cover perpendicular to the direction of plug insertion, as otherwise achieved with a lever made preferably of metal.

DETAILED DESCRIPTION

Figure 1:
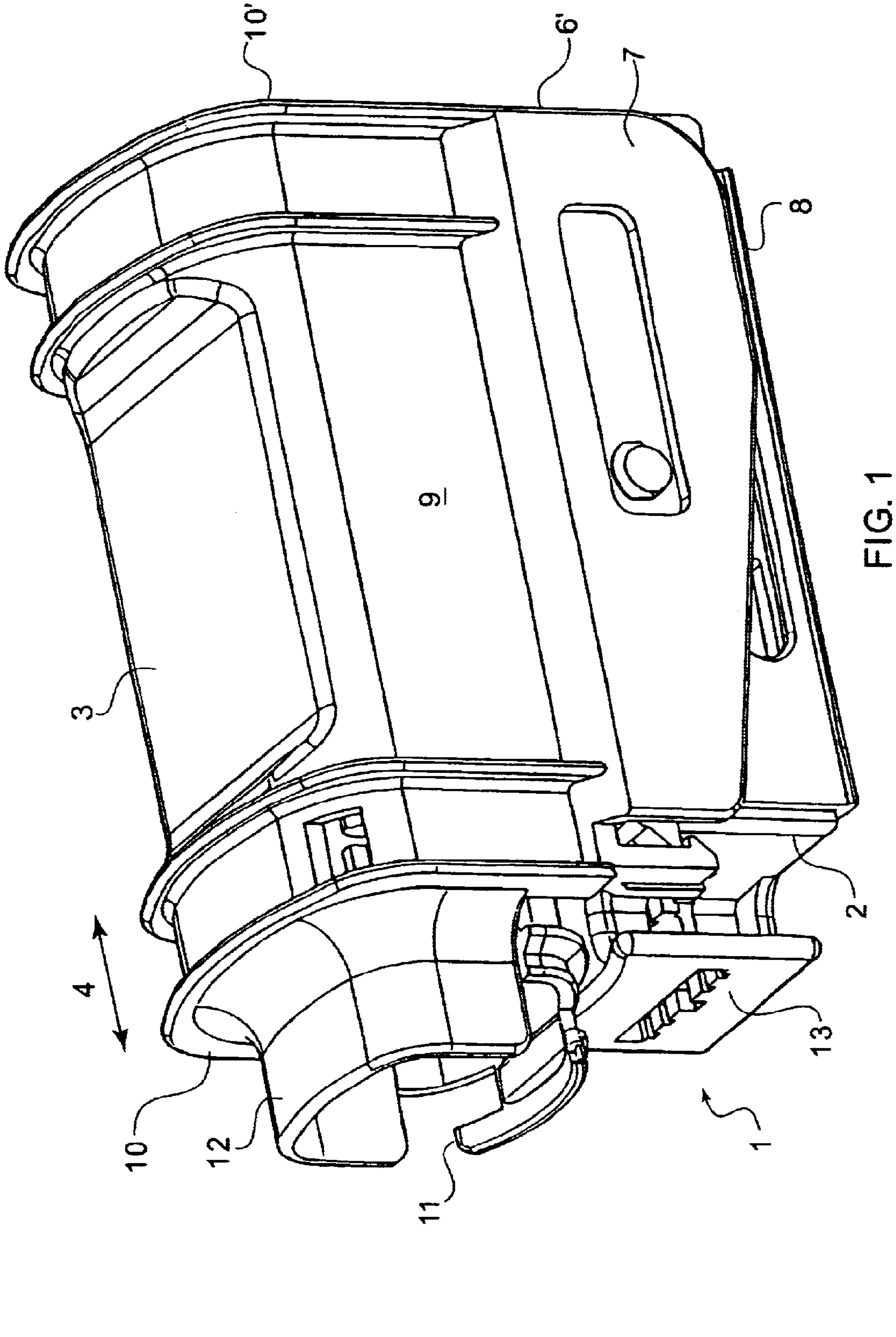
FIG. 1 shows a perspective view of the connector of the electric plug-and-socket connection according to the present invention in the locked position.
Figure 2:
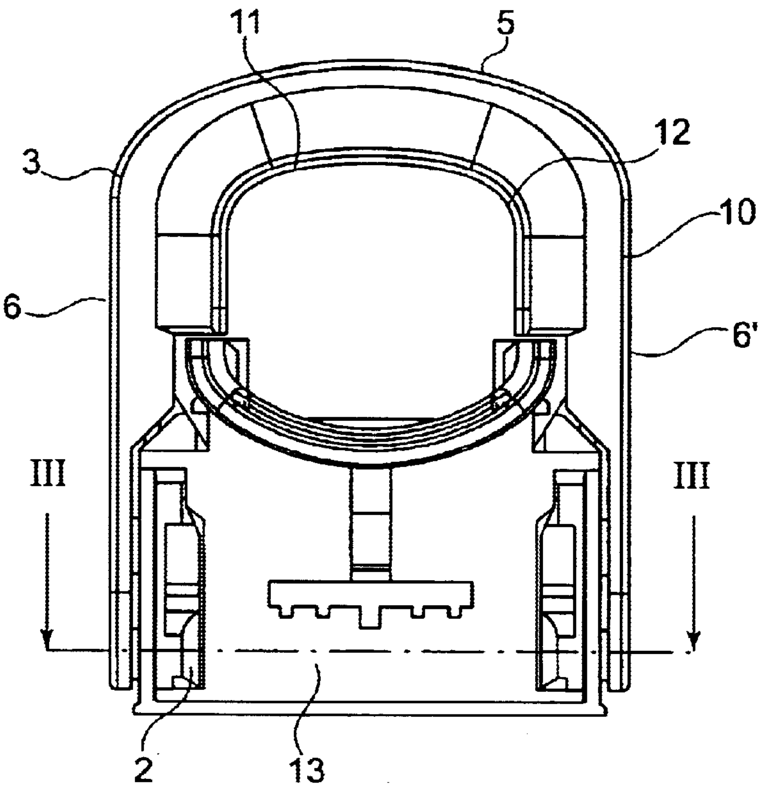
FIG. 2 shows a frontal view of the connector according to FIG. 1.
Figure 3:
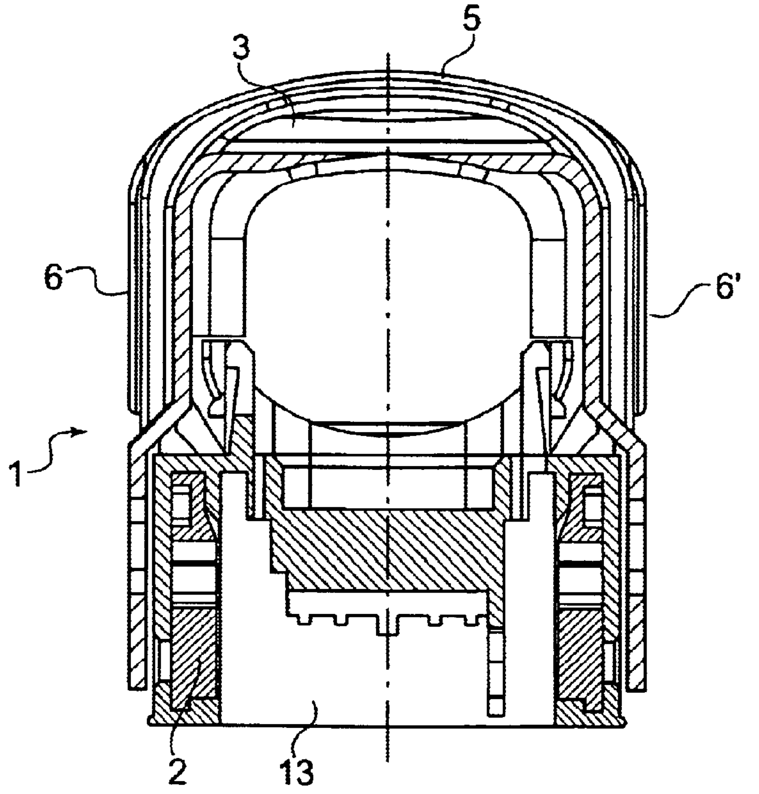
FIG. 3 shows a section through the connector according to the present invention along a line III—III in FIG. 2.

FIG. 1 shows a perspective view of connector 1. This connector 1 according to the present invention has a connector housing 2 and a cover 3 arranged on this connector housing 2. Cover 3 is mounted on connector housing 2 and is displaceable in the directions indicated by arrow 4 and may assume positions I–III in FIGS. 4–6.

Cover 3 covers connector 1 and extends toward both sides 6, 6' in such a manner that cheeks 7 extend clown to side 8. Furthermore, gripping surfaces 9 provided on sides 6,6' are designed so that the palm of a hand may rest on a top of cover 3 while the thumb and index finger rest on gripping surfaces 9. A cable outlet 11 is provided on one of two front sides 10, 10', from which cable strands may protrude (not shown in the drawing). The cable strands are protected by guide elements 12 from buckling or other damage.

Furthermore, another locking element in the form of a slide 13 is provided on connector 1. Slide 13 is displaceably mounted in connector housing 2 and is also displaceable in the directions indicated by arrow 4.

In addition, slide 13 is linked to cover 3 so that either slide 13 is first displaceable into its position illustrated in FIG. 1 and then cover 3 is displaceable into its position illustrated in FIG. 1 or both, i.e., slide 13 and cover 3 may be displaced together into the closed positions illustrated in FIG. 1.

Figure 4:
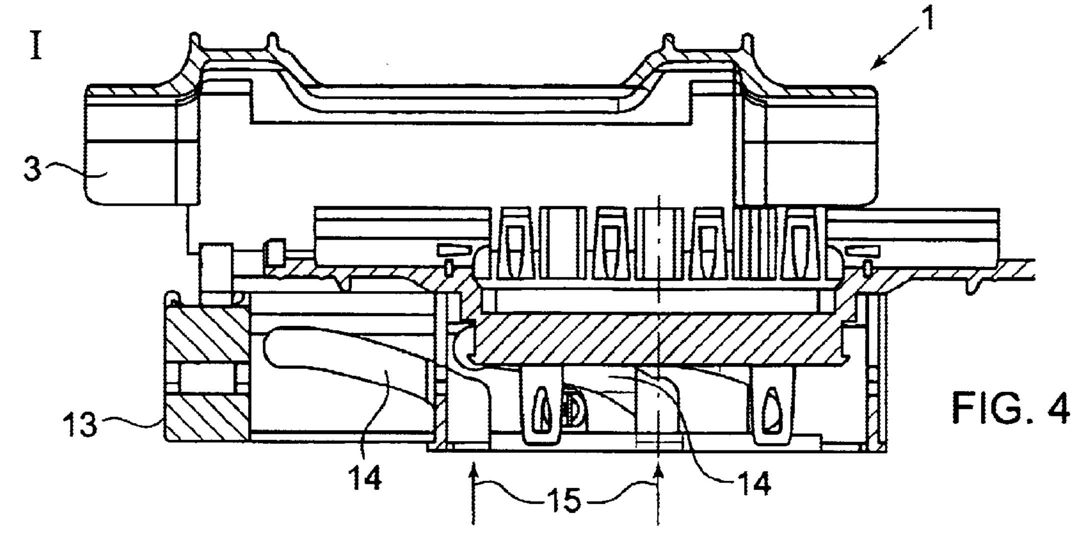
FIG. 4 shows a side view of the connector according to the present invention as shown in FIG. 1 in a partial sectional view, in the opened position (first locking element opened, second locking element opened).

For placing connector 1 on a mating connector (not shown in the drawing), both slide 13 and cover 3 assume position I illustrated in FIG. 4. This makes it possible for the pin elements, which point away from the mating connector, to engage in recesses 14, which are provided on the sides of connector 1, in the direction of arrows 15 perpendicular to the direction of slide of cover 3.

Figure 5:
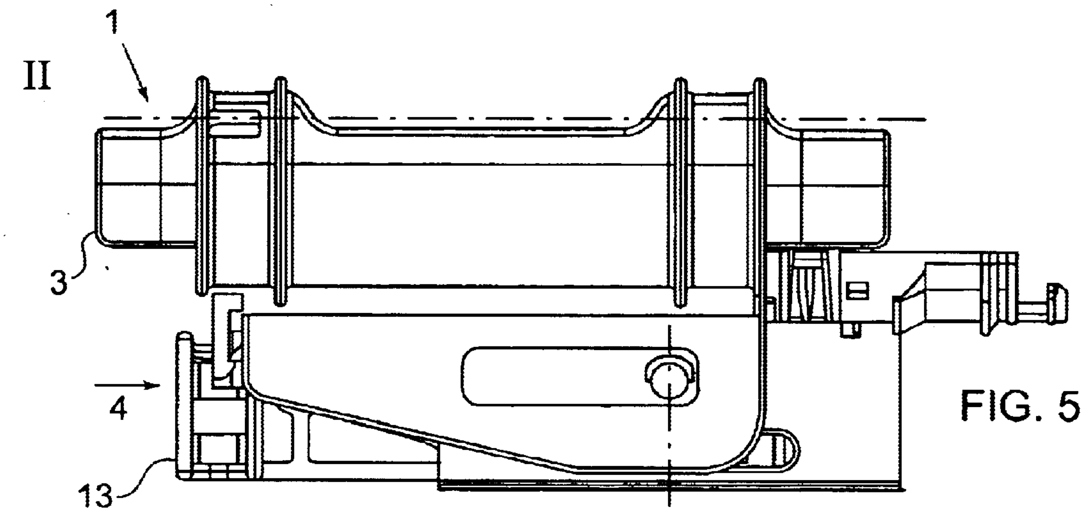
FIG. 5 shows a side view of the connector according to the present invention as shown in FIG. 1, but with the first locking mechanism closed in comparison with FIG. 4 (locking slide).

When connector 1 is placed on mating connector and the pin element engages in recess 14, then slide 13 is to be displaced in the direction of arrow 4, as illustrated in FIG. 5. Thus, connector 1 is locked with the mating connector (position II).

Figure 6:
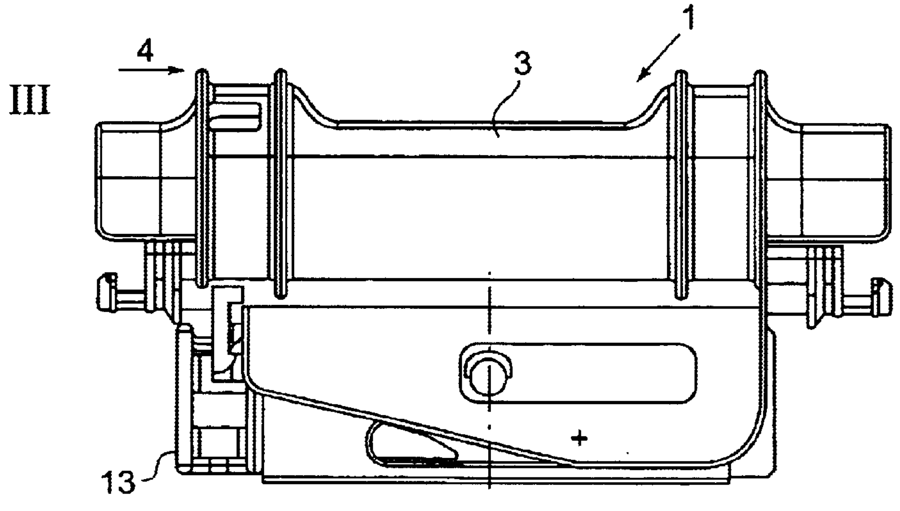
FIG. 6 shows a side view of the connector according to the present invention as shown in FIG. 1, but in the closed position without showing the mating connector.

By likewise displacing cover 3 in the direction of arrow 4, as illustrated in FIG. 6, connector 1 is pressed onto the mating connector to form a firm connection between connector 1 and the mating connector which will even withstand shaking stresses.

The movement of slide 13 and cover 3 is preferably executable simultaneously, so that only one displacement movement is necessary to establish an electric plug-and-socket connection.

In particular due to the arrangement of cover 3 and its possible displacement, it is possible to establish a plug-and-socket connection easily and effectively without having to ensure that any swivel levers, swivel claws, or the like are bent and thus their function impaired accordingly.

In addition, it has become possible to manufacture such a cable harness connector according to the present invention in a very cost effective manner because only a few parts are necessary to be able to execute the so called primary and secondary lockings.

What is claimed is:

1. An electric plug-and-socket connector comprising:

a connector including a locking slide linked to a sliding cover, the connector having a connector housing, the locking slide displaceably mounted in the connector housing and movable between a first position and a second position, the locking slide having sides and recesses in the sides configured to engage connector pin elements, the sliding cover having a cable outlet and slidingly disposed over the connector housing, the sliding cover movable between a first position and a second position, the connector pin elements insertable into the recesses in a direction perpendicular to a direction of slide of the sliding cover.

2. The plug-and-socket connector according to claim 1, wherein the sliding cover in the first position substantially covers two sides of the connector housing.

3. The plug-and-socket connector according to claim 1 wherein the sliding cover has a substantially flat top.

4. The plug-and-socket connector according to claim 1, wherein the sliding cover has sides with gripping surfaces.

* * * * *